US007952510B2

(12) United States Patent
Shimomura et al.

(10) Patent No.: US 7,952,510 B2
(45) Date of Patent: May 31, 2011

(54) SOLID-STATE IMAGING DEVICE, DRIVING METHOD THEREOF, AND CAMERA

(75) Inventors: Kenichi Shimomura, Hyogo (JP); Kenji Watanabe, Osaka (JP)

(73) Assignee: PANASONIC Corporation, Osaka (JP)

( * ) Notice: Subject to any disclaimer, the term of this patent is extended or adjusted under 35 U.S.C. 154(b) by 4 days.

(21) Appl. No.: 12/342,707

(22) Filed: Dec. 23, 2008

(65) Prior Publication Data

US 2009/0167586 A1 Jul. 2, 2009

(30) Foreign Application Priority Data

Dec. 26, 2007 (JP) ................................ 2007-335346

(51) Int. Cl.
*H03M 1/34* (2006.01)
(52) U.S. Cl. ........ 341/164; 341/118; 341/120; 341/155; 341/169; 341/170; 348/294; 348/308
(58) Field of Classification Search .................. 341/155, 341/169, 170; 348/294, 308
See application file for complete search history.

(56) References Cited

U.S. PATENT DOCUMENTS

| 4,367,457 | A | * | 1/1983 | Tadauchi et al. ............... | 341/132 |
|---|---|---|---|---|---|
| 5,247,367 | A | | 9/1993 | Lee | |
| 5,432,830 | A | | 7/1995 | Bonnot | |
| 5,877,715 | A | | 3/1999 | Gowda et al. | |
| 7,129,883 | B2 | | 10/2006 | Muramatsu et al. | |
| 7,156,486 | B2 | | 1/2007 | Eguchi et al. | |
| 7,292,177 | B2 | * | 11/2007 | Muramatsu et al. ........... | 341/164 |
| 7,315,273 | B2 | | 1/2008 | Muramatsu et al. | |
| 7,375,672 | B2 | * | 5/2008 | Muramatsu et al. ........... | 341/164 |
| 7,471,230 | B2 | * | 12/2008 | Tooyama et al. .............. | 341/164 |
| 7,495,597 | B2 | * | 2/2009 | Muramatsu et al. ........... | 341/164 |
| 7,629,914 | B2 | * | 12/2009 | Muramatsu et al. ........... | 341/164 |
| 2006/0208158 | A1 | | 9/2006 | Masashi | |
| 2006/0214086 | A1 | * | 9/2006 | Fukushima ................ | 250/208.1 |
| 2007/0019091 | A1 | | 1/2007 | Muramatsu et al. | |
| 2007/0024728 | A1 | | 2/2007 | Muramatsu et al. | |
| 2007/0024729 | A1 | | 2/2007 | Muramatsu et al. | |
| 2007/0024730 | A1 | | 2/2007 | Muramatsu et al. | |
| 2007/0024731 | A1 | | 2/2007 | Muramatsu et al. | |
| 2007/0258004 | A1 | | 11/2007 | Honda et al. | |
| 2008/0018770 | A1 | | 1/2008 | Kato | |
| 2008/0019472 | A1 | | 1/2008 | Muramatsu et al. | |

(Continued)

FOREIGN PATENT DOCUMENTS

JP       2000-156796 A       6/2000

(Continued)

OTHER PUBLICATIONS

English language Abstract JP 2005-323331 A (Nov. 17, 2005).
English language Abstract JP 2005-311933 A (Nov. 17, 2005).
English language Abstract and partial translation of JP 2000-156796 A (.

*Primary Examiner* — Linh V Nguyen
(74) *Attorney, Agent, or Firm* — Greenblum & Bernstein, P.L.C.

(57) ABSTRACT

It is an object of the present invention to provide a solid-state imaging device for enhancing accuracy of AD conversion and active switching of up-counting and down-counting in the asynchronous counter without limiting the AD conversion frequency. The solid-state imaging device according to the present invention includes an asynchronous counter having an up-counting mode in which up-counting is performed, a down-counting mode in which down-counting is performed, and a holding mode for switching operation settings between the up-counting and the down-counting while maintaining a count value held in the asynchronous counter.

12 Claims, 11 Drawing Sheets

U.S. PATENT DOCUMENTS

| | | |
|---|---|---|
| 2008/0170137 A1* | 7/2008 | Matsumoto et al. .......... 348/241 |
| 2008/0231491 A1 | 9/2008 | Muramatsu et al. |
| 2009/0167586 A1* | 7/2009 | Shimomura et al. ......... 341/169 |
| 2009/0284629 A1* | 11/2009 | Nakao et al. ................. 348/294 |
| 2010/0033362 A1* | 2/2010 | Kitami ........................... 341/169 |
| 2010/0225796 A1* | 9/2010 | Lim et al. ...................... 348/308 |

FOREIGN PATENT DOCUMENTS

| | | |
|---|---|---|
| JP | 2005-311933 A | 11/2005 |
| JP | 2005-323331 A | 11/2005 |

* cited by examiner

PRIOR ART

PRIOR ART

SOLID-STATE IMAGING DEVICE, DRIVING METHOD THEREOF, AND CAMERA

BACKGROUND OF THE INVENTION (1) Field of the Invention

The present invention relates to solid-state imaging devices for detecting physical quantity distribution of visible light, electromagnetic waves, and particle radiation such as alpha rays and beta rays, and more particularly to a solid-state imaging device having an asynchronous counter which realizes a CDS operation of AD conversion circuit which receives output signals from the photoelectric conversion device arranged in rows and columns, the driving method thereof, and a camera.

(2) Description of the Related Art

In recent years, MOS image sensors (hereinafter referred to as "MOS sensors") in which peripheral circuits such as an AD conversion circuit can be incorporated have been actively developed, and the number of products has been increasing, as a counterpart of Charge Coupled Devices image sensors (hereinafter referred to as "CCD sensor"), which have established their use as image sensors, that is, the key device in a digital camera and a video camera.

Unlike the CCD sensor using a specific semiconductor process, one of the features of the MOS sensor is its convenience. More specifically, a timing control circuit, a signal processing circuit and other circuits can be mounted on a single semiconductor chip.

The value of image sensor is determined by its image quality, and CCD sensors have established better quality in that regard. However, in recent years, a technology for performing CDS and analog-digital (analog/digital, A/D, AD) conversion essential after a signal is outputted from the pixel on the same chip as the MOS sensor has been developed, and MOS image sensors that are comparable with CCD sensors in image quality have been developed.

Here, a brief description is made for CDS which is signal processing specific to the image sensors. The signal levels read out from the pixels have a variation caused by offset. However, since the offset value can be read out immediately after the pixels are reset (this signal levels are referred to as reset levels), it is possible to obtain true pixel signal level by reading out the reset level and the signal level from the pixel, and subtracting the reset level from the signal level. This process is referred to as Correlated Double Sampling (CDS). Performing CDS on an analog signal is referred to as analog CDS, and performing CDS on a digital signal is referred to as digital CDS.

The following describes a conventional analog CDS. Various methods have been proposed for the analog CDS, in most of the methods, CDS is performed by subtracting the reset level from the signal level using a capacitor.

This method accompanies sampling on the capacitor, and thermal noise $N_{Thermal}$ is sampled when closing a switch, which causes a problem that noise that cannot be fully removed by CDS is left. The following expression shows the thermal noise.

$N_{thermal} = kT/C$ ($k$: Boltzmann coefficient, $T$: absolute temperature, $C$: capacitance of capacitor)

To put it differently, although the thermal noise can be reduced by increasing the capacitance, the capacitance cannot be easily increased since there is a tradeoff between the area (resource on the chip) and the capacitance. Introducing a device having a larger capacitance per unit area can surely reduce the area. However, it does not change the inverse relationship described above. Furthermore, it should be noted that the C-V characteristic (voltage dependency of the capacitance) of the device used for the capacitor limits the performance.

On the other hand, when performing the digital CDS, it is not necessary to provide a capacitor that causes a problem with regard to area in the analog CDS.

Instead, digital CDS can be realized by performing an AD conversion for both a signal level and a reset level at high accuracy, and subtracting the values as digital values.

Conventionally, the analog CDS has been in the mainstream since in the digital CDS, low AD conversion accuracy leads to low CDS. On the other hand, advancement in AD conversion technology on MOS sensors improves the accuracy of digital CDS. Thus, along with improving accuracy of the AD conversion, efficient digital CDS has been requested.

Digital CDS can be realized in many ways, and Patent References 1: U.S. Pat. No. 5,877,715 and Patent Reference 2: Japanese Unexamined Patent Application Publication No. 2005-323331 disclose a digital CDS method in which asynchronous up/down counters are provided in each column of the column AD conversion circuits in the MOS sensor, AD conversion is performed by down-counting when reading the reset level, and another AD conversion is performed by up-counting when reading the signal level, and performs the following calculation on the counter has been proposed.

(Signal level)−(Reset level)=(True signal level)

Note that, it is assumed that an asynchronous counter is suitable for a counter as a component in the column AD conversion circuit for accelerating and for improving the accuracy since the asynchronous counter is easy to adjust increasing frequency. Both the Patent Reference 1 and 2 utilize the asynchronous counters.

FIG. 6 shows a configuration of a MOS sensor according to the first conventional example described in Patent Reference 1 and Patent Reference 2. With reference to FIG. 6, the configuration of the MOS sensor according to the first conventional example including the column AD conversion circuits is described.

The MOS sensor according to the first conventional example includes, for each column of the pixels 1101, a column AD conversion circuit 1106 including a comparator 1107 and a column U/D counter 1208. The clock generating circuit 1120 supplies a clock signal 1121 to the column U/D counter 1208 in the column AD conversion circuit 1106, not just to a binary counter 1104. The binary value outputted from the binary counter 1104 is inputted to a DA conversion circuit 1105, and the DA conversion unit 1105 generates an analog ramp voltage (triangle wave) 1122 according to the input binary value. The analog ramp voltage 1122 is inputted to the comparator 1107 as a reference potential. Pixel signals are input from the pixel 1101 via a readout signal line 1103 to the other input of the comparator 1107. Furthermore, the digital value held in the column U/D counter in each column is outputted to outside the chip from an n-bit common output bus signal line 1126 and an output buffer 1109.

Next, the AD conversion in the MOS sensor according to the first conventional example is described.

First, the column U/D counter 1208 in the column AD conversion circuit 1106 is set to the down-counting mode for performing AD conversion of the reset level. The column U/D counter 1208 and the binary counter 1104 is initialized with the initialization signal (not shown), and the initial value of the analog ramp voltage 1122 is supplied to one of the input units of the comparator 1107. Next, the reset levels of pixels are read out from all of the pixels 1101 in the selected row, and supplied to the other input unit of the comparator 1107. With this, staring the input of the clock signal 1121 to the binary counter 1104 and the column U/D counter 1208 starts the binary counter 1104 counting from the initial value. Then, the DA conversion unit 1105 starts generating, from an initial value, the analog ramp voltage 1122 according to the count value of the binary counter 1104. Furthermore, the column U/D counter 1208 in the column AD conversion circuit 1106 starts down-counting the inputted clock signal 1121.

Next, when the magnitude relationship between two signals inputted to the comparator 1107 in a certain column is switched, that is, when the analog ramp voltage 1122 goes across the reset level at the comparator input in the certain column and the comparator 1107 is inverted, the clock signal 1121 inputted to the column counter 1208 in that column is masked, the column U/D counter 1208 stops down-counting, and holds the count value at the point in time. The count values of the analog ramp voltage 1122 and the column counter 1208 are synchronized with each other with the clock signal 1121, and thus the reset level of the pixel in that column is AD converted with the operation described above (However, note that the reset level is held as a minus value on the counter).

In order to assure that the AD conversion for the reset levels of all columns is performed, the clock signal 1121 is input to the binary counter 1104 from the clock generating circuit 1120 during a period corresponding to a predetermined AD conversion range of the reset level. The clock signal 1121 stops once when the AD conversion period of the reset level ends.

Next, in order to perform AD conversion at the signal level, the binary counter 1104 is set to the initial value again (the column U/D counter 1208 is not reset), the DA conversion unit 1105 to which the count value of the binary counter 1104 supplies the initial value of the analog ramp voltage 1122 to one of the input units of the comparator 1107. Afterwards, the column U/D counter 1208 is switched to the up-counting mode (Here, the column U/D counter 1208 needs hold a value obtained by down-counting).

Next, the signal levels of the pixels are read out from the pixel 1101 in the selected row, and supplied to the other input units of the comparator 1107. With this, resuming the input of the clock signal 1121 to the binary counter 1104 and the column U/D counter 1208 starts the binary counter 1104 counting from the initial value. Then, the DA conversion unit 1105 starts generating, from an initial value, the analog ramp voltage 1122 according to the count value of the binary counter 1104. The column U/D counter 1208 in the column AD conversion circuit 1106 starts up-counting the inputted clock signal 1121 with the value obtained by the down-counting as the initial value.

Next, when the magnitude relationship of the two signals inputted to the comparator 1107 in a certain column is switched that is, when the analog ramp voltage 1122 goes across the signal level at the comparator input in the certain column and the output signal from the comparator 1107 is inverted, the clock signal 1121 inputted to the column U/D counter 1208 in that column is masked, the column U/D counter 1208 stops up-counting, and holds the count value at the point in time. With the operations described above, AD conversion for the true signal level obtained by subtracting the reset level from the signal level of the pixels is performed.

In order to assure that AD conversion is performed on the signal level of all of the columns, the clock signal 1121 from the clock generating circuit 1120 is inputted to the binary counter 1104 during a period corresponding to a predetermined AD conversion range of the signal level.

With the process described above, processes from reading out signals from pixels in one row to the completion of AD conversion including CDS are performed.

As shown in the first conventional example, including a column U/D counter in each column of the AD conversion circuit facilitates the digital CDS. Here, it is necessary for the column U/D counter to be able to switch counting directions actively. Active switching of the counting direction refers to switching of operation mode from up-counting to down-counting (or from down-counting to up-counting), and resume the counting with the value held before the switching.

With regard to realization of digital CDS in the column AD conversion circuit in an image sensor, Patent Reference 3: Japanese Unexamined Patent Application Publication No. 2005-311933 discloses a technology particularly related to a column U/D counter, which is described as the second conventional example.

As disclosed in Patent Reference 3, a ripple counter which is an asynchronous counter is suitable for a column U/D counter in the column AD conversion circuit in terms of saving area, high speed, and low noise. However, a ripple carry counter which is a general asynchronous counter can be used in both counting directions by switching the connection for up-counting and the connection for down-counting with a switch, it is not suitable for active switching of the counting directions. FIG. 7 describes the reason why the ripple carry counter is not suitable with reference to FIG. 7.

FIG. 7 is a block diagram showing a configuration of a general asynchronous ripple carry counter shown in FIG. 18 of Patent Reference 3. In FIG. 7, selectors 922, 924, and 926 functions as switches to switch the counting directions. More specifically, the asynchronous counter up-counts when the control signal SW is in H (high level), and down-counts when the control signal SW is in L (low level). The clock input terminal CK in each FF (D flip-flop) which latches the data in the negative edge, one of the non-inverted output terminal Q or inverted output terminal NQ (indicated with a horizontal bar "-" over Q in the diagram) of the FF in the previous stage is input via a selector. Thus, depending on the value held in the FF of the previous stage, a negative edge appears on the selector output upon switching, and the input of the negative edge to the clock input terminal CK inverts the values held by some of the FFs, which leads to a broken count value.

As described above, when an asynchronous counter capable of switching the counting direction is configured with switches, even if independent operation (up-counting and down-counting) is realized by resetting immediately after the switching, it is not possible to resume the counting operation from the count value before the switching after up-down is switched. For example, the time chart in FIG. 19 of Patent Reference 3 shows broken count values when the counter in FIG. 7 (FIG. 18 in Patent Reference 3) is switched from down-counting to up-counting.

The technology disclosed in Patent Reference 3 in order to solve the problem is based on an idea that correct data is obtained by switching the bit with broken data (1 and 0 are switched) upon switching once again, regardless of the embodiments. FIG. 8 shows the circuit structure, and FIG. 9 shows the detailed drawing. FIGS. 10 and 11 show the waveforms during operation.

As shown in FIG. 8, a counter circuit 400 which is the conventional example has a structure that a plurality of negative-edge D flip-flops 412, 414, 416, and 418 (collectively 410) are connected by cascade connection. Each of the flip-flops 410 has an inverting output NQ (indicated with a horizontal bar over Q in the diagram) connected to a D input terminal thereof. Thus, the counter circuit 400 is capable of functioning as a 4-bit asynchronous counter.

Furthermore, between the respective adjacent pairs of the flip-flops 410, the counter circuit 400 includes three-input single-output tri-value switching units 422, 424, and 426 (collectively 420) that switch among three values, namely, the non-inverted output Q, the inverting output NQ, and a power supply (Vdd) level. More specifically, the tri-value switches 420 can be respectively configured by a pair of two-input single-output binary switching unites 432 and 433, a pair of two-input single-output binary switching unites 434 and 435, and a pair of two-input single-output binary switching unites 436 and 437, as shown in FIG. 9. These binary switching units are collectively referred to as binary switching unites 430.

In this example, each of the binary switching units 430 is switched according to switching control signals SL and FL generated at different timings as the two-bit switching control signals SW1 and SW2 supplied from a controller (not shown).

The binary switching units 432, 434, and 436 at the previous stages switch the non-inverted outputs Q and the inverting outputs NQ of the respectively associated flip-flops 410 according to the switching control signal SL, and pass the results to one of the input terminals of the associated binary switching unites 433, 435, and 437 at the subsequent stages. The binary switching unites 433, 435, and 437 at the subsequent stages switches between the data passed from the binary switching unites 432, 434, and 436 at the previous stages and the power supply level input to the other input terminals thereof according to the switching control signal FL, and input the results to the clock terminals CK of the subsequent flip-flops 410.

For example, the previous binary switching unit 430 (432, 434, and 436) selects the non-inverted output NQ and the inverting output Q of the preceding flip-flop 430 according to the switching control signal SL, and supplies it to one input terminal of the subsequent binary switching unit 430 (433, 435, and 437). The switching control signal SL controls the previous binary switching unit 430 (432, 434, and 436), thereby switching the counting operation of the counter circuit 400 between up-counting and down-counting.

The subsequent binary switch 430 (433, 435, and 437) selects one of the supply of the output (non-inverting output NQ or inverting output Q) of the preceding flip-flop 410, output from the previous binary switch 430 (432, 434, and 436) and H (high level signal) and outputs the selected signal to the clock terminal of the succeeding flip-flop 410.

The switching control signal FL controls the subsequent binary switch 430 (433, 435, and 437) so that the supply of the output of the preceding flip-flop 410 (non-inverting output NQ or inverting output Q) to the clock terminal CK of the succeeding flip-flop 410 is stopped for a predetermined period after switching of counting mode, and so that a signal corresponding to a clock is supplied to the clock terminal CK of the succeeding flip-flop 410 when the supply of non-inverting output NQ or inverting output Q is resumed. Thus, the count value before the switching is recovered when the counting mode is switched between the up-counting mode and the down-counting mode.

FIG. 10 is a timing chart for describing the operation of the counter circuit 400. In this example, the switching control signal SL is switched from high level to low level after up-counting is performed from a count value of 0 to a count value of 6 (t30). With this, the count value changes from "6" to "10", and is broken.

Furthermore, after the switching of the switching control signal SL for switching counting mode, before a negative edge of the clock CK0 for down-counting is input to the first flip-flop 410, an active-H one-shot pulse is applied to the subsequent binary switches 433, 435, and 437 as the switching control signal FL (t32 to t34). With this, the broken count value "10" is fixed back to "6".

The process of breaking and recovering of count value is described in more detail with reference to FIG. 11.

FIG. 11 illustrates clock signals CK1 to CK3 inputted to the clock input terminal of the flip-flops 414, 416, and 418. At the timing t30 in FIG. 11, the switching control signal SL changes from hi level to low level, the selectors 434 and 436 generate negative edges in the clock signal (A and B in FIG. 11). With this, the flip-flops 416 and 418 invert the values being held (C and D in FIG. 11). The count values are broken as described.

Furthermore, with a one-shot pulse in the switching control signal FL applied in the period between the timing t32 to timing t34, the selectors 435 and 437 generates negative edges in the clock signal CK2 and CK3 once more. With this, the flip-flops 416 and 418 invert the values being held again (E and F in FIG. 11). The count values are recovered as described.

With this, it is possible to substantially hold the count values before switching the counting mode, and down-counting can be performed after up-counting while maintaining the continuity of the count values.

As described above, with the second conventional example, active switching from up-counting to down-counting, or from down-counting to up-counting, is substantially possible since the broken data is recovered.

SUMMARY OF THE INVENTION

However, according to the conventional technology for recovering the inverted count values, two stages of selectors are included in the carry propagation path between each flop-flop, which increases delay in carry propagation.

To put it differently, increased carry propagation delay limits the AD conversion frequency, and prevents acceleration (reducing the clock frequency). The column AD conversion units are usually included as many as the number of columns of pixel array, which is as many as a few thousands columns. Since the delay varies with columns, the column with the longest carry delay limits the AD conversion frequency.

For example, it causes a problem in the following case.

The first case relates to the inversion and the recovery in FIG. 11. More specifically, in the conventional technology, a digital signal changes, for example, that the unfavorably inverted bit is inverted again. The change in the digital signal occurs in a period, during CDS, from the point in time when the digitalization of standard component completes to the point in time when the digitalization of the signal component starts. Although the counting operation of the column AD conversion unit is temporarily suspended, the comparator in the column AD conversion unit and the circuit in the previous stage prepares for the AD conversion with the next count operation by amplifying or stabilizing the input of the analog signal indicating the signal component to the comparator. With the noise component due to the change in digital signal generated by the inversion of bit and another inversion of bit, there is a possibility that the offset component that cannot be removed by the comparator in the previous stage of the column AD conversion unit or an upstream circuit is supplied and reduces the accuracy of the AD conversion. Furthermore, since the bit inversion occur dependent on the data held by the flip-flop on the lower order side and the amount is different per column. Thus it is not possible to remove as an offset common to all of the pixels, and there is a possibility that the influence on image quality may be larger. Extending the time until sampling the input to the comparator after inverting and recovering the counter value can prevent the influence: however, it is necessary to raise the AD conversion frequency for achieving the same AD conversion resolution, since the time that can be used for AD conversion is reduced. Furthermore, it is necessary to reduce a frame rate in order to achieve the same AD conversion resolution with the same AD conversion frequency.

The second case relates to a detection of counter overflow of underflow. More specifically, since overflow or underflow of a counter is determined by the carry generated in the most significant bit, or the last stage of flip-flop, when stopping the counting upon an overflow or an underflow, it is necessary to stop the counting operation before the timing when the active edge (negative edge or positive edge) is input to the flip-flop of the least significant bit, or the first stage.

If the timing when the overflow signal (or the underflow signal) is generated from the last flip-flop is after the timing of the clock active edge of the next cycle to the flip-flop in the first stage due to slow carry propagation, the count value in the counter returns to the next value upon the overflow or the underflow (initial value). For example, the count value represents the brightness of a pixel, and thus the brightness turns to be the initial value (the darkest pixel) although it is supposed to be the highest brightness (the brightest pixel) when overflowing. Thus, the time from the active edge of the flip-flop in the first stage to the generation of the overflow (or underflow signal) in the last stage limits the AD conversion frequency.

It is an object of the present invention to provide a solid-state imaging device capable of enhancing the accuracy of AD conversion and including an asynchronous counter capable of switching between up-counting and down-counting actively without limiting the AD conversion frequency, a driving method thereof and a camera.

In order to achieve the problem above, the solid-state imaging device according to the present invention is a solid-state imaging device including: a plurality of pixel units arranged in rows and columns; and column AD conversion units each of which corresponds to one of the columns of the plurality of pixel units and is configured to convert an analog signal outputted from the column to a digital signal, in which each of the column AD conversion units includes: a comparator which compares the analog signal with a ramp signal; and an asynchronous counter which measures a time period until an output signal from the comparator is inverted, and the asynchronous counter has, as operation modes, an up-counting mode for up-counting, a down-counting mode for down-counting, and a holding mode for switching an operation setting between the up-counting and the down-counting while holding a count value held in the asynchronous counter. In addition, it is suitable for improving frequency since it does not require a bit inversion on an inverted bit for fixing the inverted bit that was necessary in the conventional technology when switching the operation setting.

Here, the asynchronous counter may include: a plurality of stages of flip-flops each of which includes a data input terminal, a clock input terminal, a non-inverted output terminal and an inverted output terminal; a first switching unit configured to switch between the holding mode and either the up-counting mode or the down-counting mode; and a second switching unit configured to switch the operation setting between the up-counting and the down-counting in the holding mode.

Here, the first switching unit may include a plurality of first selectors each of which corresponds to one of the plurality of stages of flip-flops, and each of the plurality of first selectors selects one of two signals respectively outputted from the non-inverted output terminal and the inverted terminal of the corresponding flip-flop, outputs the selected signal to a data input terminal of the corresponding flip-flop and the operation mode is set to the holding mode when the signal outputted from the non-inverted output terminal is selected. With this configuration, since a plurality of first selectors are set outside the carry propagation path, it does not increase the delay in carry propagation. Thus, it is suitable for accelerating the AD conversion frequency.

Here, the second switching unit may include a plurality of second selectors each of which corresponds to an interval between the plurality of stages of flip-flops, each of the plurality of second selectors selects one of two signals respectively outputted from the non-inverted output terminal and the inverted output terminal of the flip-flop in the previous stage, outputs the selected signal to the clock input terminal of a flip-flop in a subsequent stage, and switches the selection during a period within the holding mode. With this configuration, only one of the second selectors is arranged in each interval between the flip-flops in the carry propagation path, it is possible to avoid the limitation of the AD conversion frequency by the carry propagation delay.

Here, the solid-state imaging device according to the present invention, may include: a plurality of pixel units arranged in rows and columns; and column AD conversion units each of which corresponds to one of the columns of the plurality of pixel units and is configured to convert an analog signal outputted from the column to a digital signal, in which each of the column AD conversion units includes: a comparator which compares the analog signal with a ramp signal; and an asynchronous counter which switches the up-counting and the down-counting to measure a time period until an output signal from the comparator is inverted, and the asynchronous counter includes: a plurality of stages of flip-flops each of which includes a data input terminal, a clock input terminal, a non-inverted output terminal and an inverted output terminal; a plurality of first selectors each of which corresponds to each of the plurality of stages of flip-flops; and a plurality of second selectors each of which corresponds to an interval between the stages of the plurality of stages of flip-flops, each of the plurality of first selectors selects one of two signals respectively outputted from the non-inverted output terminal and the inverted terminal of the corresponding flip-flop, and outputs the selected signal to a data input terminal of the corresponding flip-flop, and each of the plurality of second selectors selects one of two signals respectively outputted from the non-inverted output terminal and the inverted output terminal of the flip-flop in the previous stage, and outputs the selected signal to the clock input terminal of a flip-flop in a subsequent stage.

Furthermore, the driving method and the camera for the solid-state imaging device according to the present invention includes the same configuration as described above.

The present invention enables enhancing accuracy of AD conversion, and active switching of up-counting and down-counting in the asynchronous counter without limiting the AD conversion frequency.

FURTHER INFORMATION ABOUT TECHNICAL BACKGROUND TO THIS APPLICATION

The disclosure of Japanese Patent Application No. 2007-335346 filed on Dec. 26, 2007 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Figure 1:
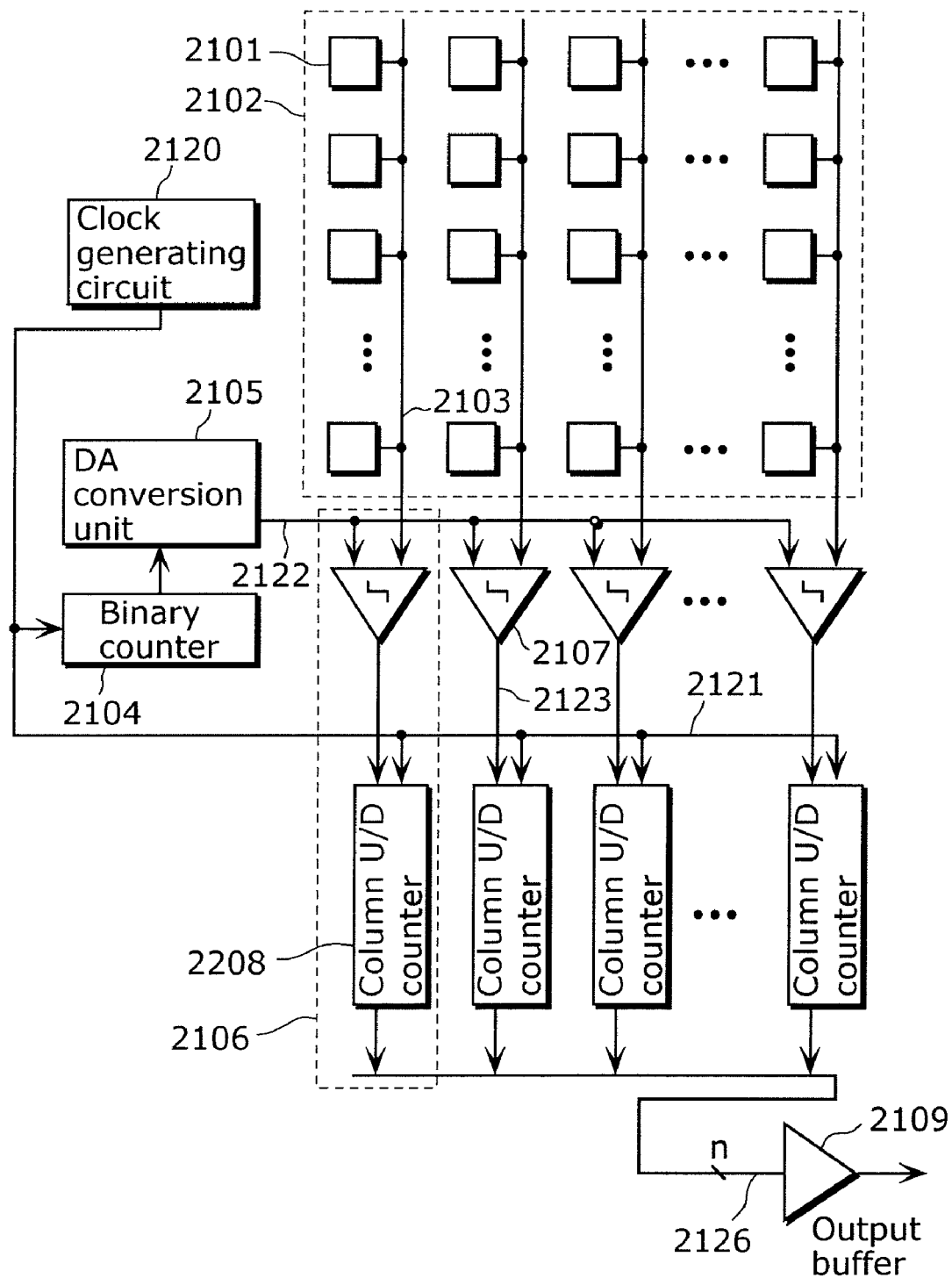
FIG. 1 is a block diagram showing the configuration of the solid-state imaging device according to the first embodiment of the present invention.

The following describes the solid-state imaging device according to each of the embodiments of the present invention with reference to the drawing. Next, a two-dimensional array MOS sensor incorporated with the column AD conversion unit (column ADC) using the counter is described. However, the solid-state imaging device is merely an example, and the configuration and the driving method according to the present invention is widely applicable to a semiconductor device for detecting the physical quantity distribution configured with a plurality of unit components arranged in line or in rows and columns, which are sensitive to light, radiation, and electromagnetic wave input from outside in line or in rows and columns.

First Embodiment

The feature of the solid-state imaging device according to the present invention is the following three operational modes are included in the column AD conversion unit. More specifically, the asynchronous counter includes an up-counting mode for up-counting, a down-counting mode for down-counting, and a data holding mode in which an operation setting indicating the up-counting and the down-counting is switched while maintaining the count value held in the asynchronous counter.

With this, switching between the operation setting indicating up-counting and down-counting does not change the count value held in the asynchronous counter, which suppresses generation of noise, and the accuracy of the AD conversion is enhanced. In addition, it is suitable for improving frequency since it does not require a bit inversion and another bit inversion for recovery that were unavoidable in the conventional technology when switching the operation setting.

FIG. 1 is a block diagram showing the configuration of the solid-state imaging device according to the first embodiment of the present invention. The solid-state imaging device is a image sensor known as a MOS image sensor (hereinafter referred to as "MOS sensor"), and includes a pixel array (imaging unit) 2102 including a plurality of pixels 2101 arranged in rows and columns, column AD conversion units 2106 each of which converts, for each column of the pixels, an analog signal output from the corresponding column to a digital signal, a binary counter 2104, a DA conversion unit (digital-analog conversion unit, digital-analog converter, DAC) 2105 which converts the output from the binary counter 2104 to output a ramp waveform signal, and an output buffer 2109 which outputs the digital signal output from the column AD conversion units 2106.

The column AD conversion unit 2106 includes a comparator 2107 which compares the analog signal output from the corresponding column and a ramp signal from the DA conversion unit 2105, an asynchronous column up down counter (column U/D counter) 2208 which measures time until the output of the comparator 2107 is inverted.

The column U/D counter 2208 includes the up-counting mode, the down-counting mode, and the data holding mode as the operation mode.

The MOS sensor includes a column AD conversion circuit 2106 including the comparator 2107 and the column U/D counter 2208 in each column of the pixels 2101. The clock generating circuit 2120 supplies the clock signal 2121 to the column U/D counter 2208 in the column AD conversion circuit 1206, not just to the binary counter 2104. The binary value output from the binary counter 2104 is input to the DA conversion unit 2105 and the DA conversion unit 2105 generates the analog ramp voltage (triangle wave) 2122 according to the input binary value. The analog ramp voltage 2122 is inputted to the comparator 2107 as a reference potential. Pixel signals are input from the pixels 2101 via the readout signal line 2103 to the other input of the comparator 2107. Furthermore, the digital value held in the column U/D counter in each column is outputted to outside the chip from the n-bit common output bus signal line 2126 and via the output buffer 2109.

The AD (analog-digital, A/D, analog/digital) conversion in the MOS sensor is described.

First, the column U/D counter 2208 in the column AD conversion circuit 2106 is set to the down-counting mode for performing AD conversion of the reset level. The column U/D counter 2208 and the binary counter 2104 have been initialized with the initialization signal (not shown), and the initial value of the analog ramp voltage 2122 is supplied to one of the input unit of the comparator 2107.

Next, the reset levels of pixels are read out from all of the pixels 2101 in the selected row, and supplied to the other input unit of the comparator 2107. With this, staring the input of the clock signal 2121 to the binary counter 2104 and the column U/D counter 2208 starts the binary counter 2104 counting from the initial value. Then, the DA conversion unit 2105 starts generating, from an initial value, the analog ramp voltage 2122 according to the count value of the binary counter 2104. Furthermore, the column U/D counter 2208 in the column AD conversion circuit 2106 starts down-counting in response to the input clock signal 2121.

Next, when the magnitude relationship of the two signals inputted to the comparator 2107 in a certain column is switched, that is, when the analog ramp voltage 2122 goes across the reset level at the comparator input in the certain column and the output signal from the comparator 2107 inverts, the clock signal 2121 inputted to the column counter 2208 in that column is masked, the column U/D counter 2208 stops up-counting, and holds the count value at the point in time. The count values of the analog ramp voltage 2122 and the column counter 2208 are synchronized with each other with the clock signal 2121, and thus the reset levels of the pixels in that column is AD converted with the operation described above (However, note that the reset level is held as a minus value on the counter).

In order to assure that the AD conversion for the reset levels of all columns is performed, the clock signal 2121 is input to the binary counter 2104 from the clock generating circuit 2120 during a period corresponding to a predetermined AD conversion range of the reset level. When the AD conversion period of the reset level ends, the clock signal 2121 stops once.

Next, in order to perform AD conversion at the signal level, the binary counter 2104 is reset to the initial value again, and the DA conversion unit 2105 to which the count value of the binary counter 2104 is input supplies the initial value of the analog ramp voltage 2122 to one of the input units of the comparator 2107 without resetting the column U/D counter 2208.

Subsequently, the mode of the column U/D counter 2208 is switched with the step as follows. More specifically, the first switching step which switches the mode of the column U/D counter 2208 from down-counting mode to the holding mode, and the second switching step in which the setting of the counting operation of the column U/D counter 2208 in the holding mode (from up-counting to down-counting) is switched, and the third switching step in which the holding mode is switched from the holding mode to the up-counting mode are performed.

With these steps, the column U/D counter 2208 can be switched to the up-counting mode while maintaining the count value.

Next, the signal levels of the pixels are read out from the pixels 2101 in the selected row, and supplied to the other input unit of the comparator 2107. With this, resuming the input from the clock signal 2121 to the binary counter 2104 and the column U/D counter 2208 starts the binary counter 2104 counting from the initial value. Then, the DA conversion unit 2105 starts generating, from an initial value, the analog ramp voltage 2122 according to the count value of the binary counter 2104. The column U/D counter 2208 in the column AD conversion circuit 2106 starts up-counting the inputted clock signal 2121 with the value obtained by the down-counting as the initial value.

Next, when the magnitude relationship of the two signals inputted to the comparator 2107 in a certain column is switched, that is, when the analog ramp voltage 2122 goes across the signal level at the comparator input in the certain column and the output signal from the comparator 2107 inverts, the clock signal 2121 inputted to the column counter 2208 in that column is masked, the column U/D counter 2208 stops up-counting, and holds the counted value at the point in time. With the operations described above, AD conversion for the true signal level obtained by subtracting the reset level from the signal level of the pixels is performed.

In order to assure that AD conversion is performed on the signal level of all of the columns, the clock signal 2121 is inputted to the binary counter 2104 from the clock generating circuit 2120 during a period corresponding to a predetermined AD conversion range of the signal level.

With the process described above, processes from reading out of signals from pixels in one row to the completion of AD conversion including CDS are performed.

Figure 2:
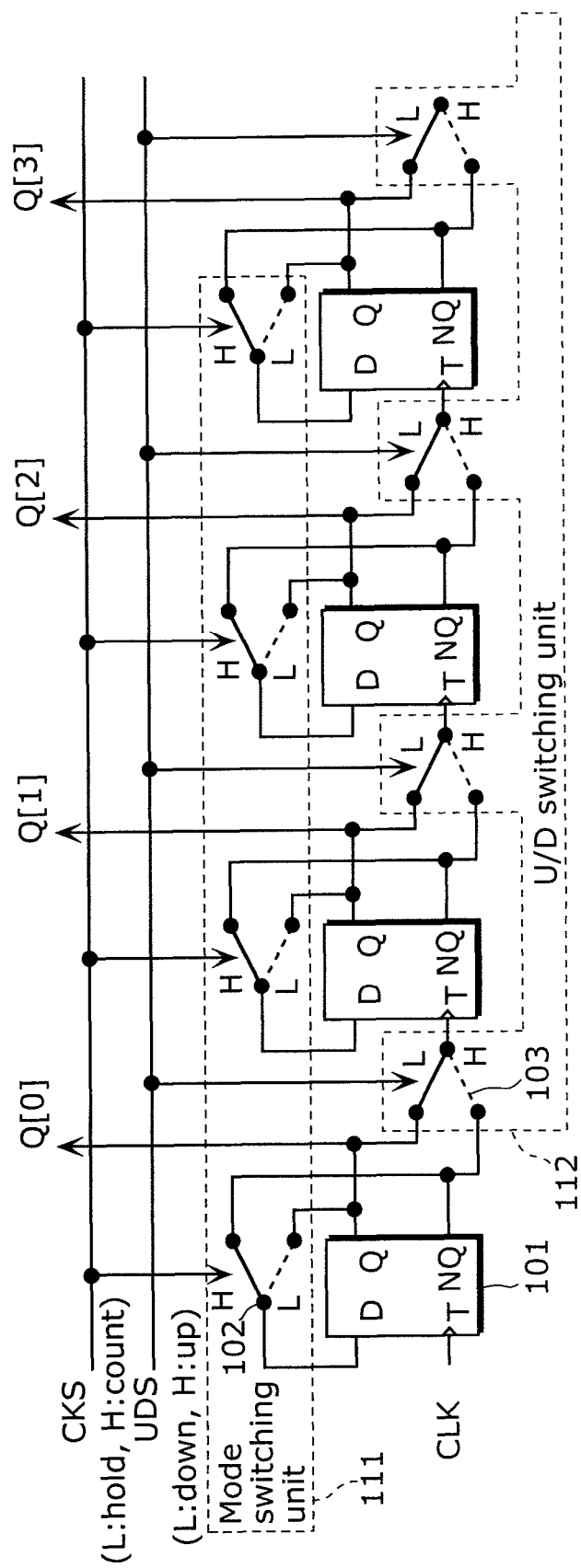
FIG. 2 is a block diagram showing the configuration of an asynchronous counter as a specific example of the column U/D counter.

FIG. 2 is a circuit block diagram showing the configuration of an asynchronous counter as a specific example of the column U/D counter 2208. The asynchronous counter includes: a plurality of stages of D flip-flops 101 each of which includes a data input terminal D, a clock input terminal T, a non-inverted output terminal Q and an inverted output terminal NQ, a first selectors corresponding to each of the plurality of stages of flip-flops, and a second selector corresponding to the interval between the plurality of steps of flip-flops.

Each of the D flip-flops 101 (hereinafter simply referred to as FF101), is a positive-edge D flip-flops, and is a so-called one-bit data latch circuit. Note that the reset input of the FF101 is not shown.

The first selectors 102 function as a mode switching unit 111 which switches between the holding mode and the counting mode (more specifically, the up-counting mode and the down-counting mode).

The second selectors 103 function as a U/D switching unit 112 which switches the operation setting indicating up-counting or down-counting in the holding mode.

Each of the first selectors 102 is a selector with two-input single-output selector, and selects one of the signal output from the non-inverted output terminal Q and the signal output from the inverted output terminal NQ of the corresponding FF101, and outputs the selected signal to the data input terminal D in the corresponding FF101.

The second selector 103 is a two-input single-output selector, and selects one of the signal output from the non-inverted output terminal Q and the inverted output terminal NQ in the FF101 in the previous stage, and outputs the selected signal to the clock input terminal T in the FF101 in the next stage.

A circuit of one-bit in the asynchronous counter is configured through connecting the three circuit components, namely, the FF101, the first selector 102, and the second selector 103. However, the second selector 103 does not exist in the subsequent stage of the FF101 in the final stage.

With regard to the detail of the connection, the output Q and the inverted output NQ of the FF101 is connected to both the first selector 102 and the second selector 103. Meanwhile, the output of the second selector 103 is connected to the clock input T in the FF101 one-bit higher whereas the output of the first selector 102 is connected to the data input D of the same FF101.

Next, the change in the counter values with the control signals CKS and UDS in the asynchronous counter is described.

When the control signal CKS is in H, the first selector 102 connects the inverted output NQ in the FF 101 to the data input D in the same FF101. Here, the change in the connected signal to the clock input T in each of the FF101, the value of the FF is inverted at the positive edge since the FF101 are positive-edge FF (counting mode).

Meanwhile, when the control signal CKS is in L, the first selector 102 connects the output Q in the FF101 to the data input D in the same FF101. Here, even if the signal inputted to the clock input T in each of FF101 changes, the value does not change (data holding mode).

Figure 3:
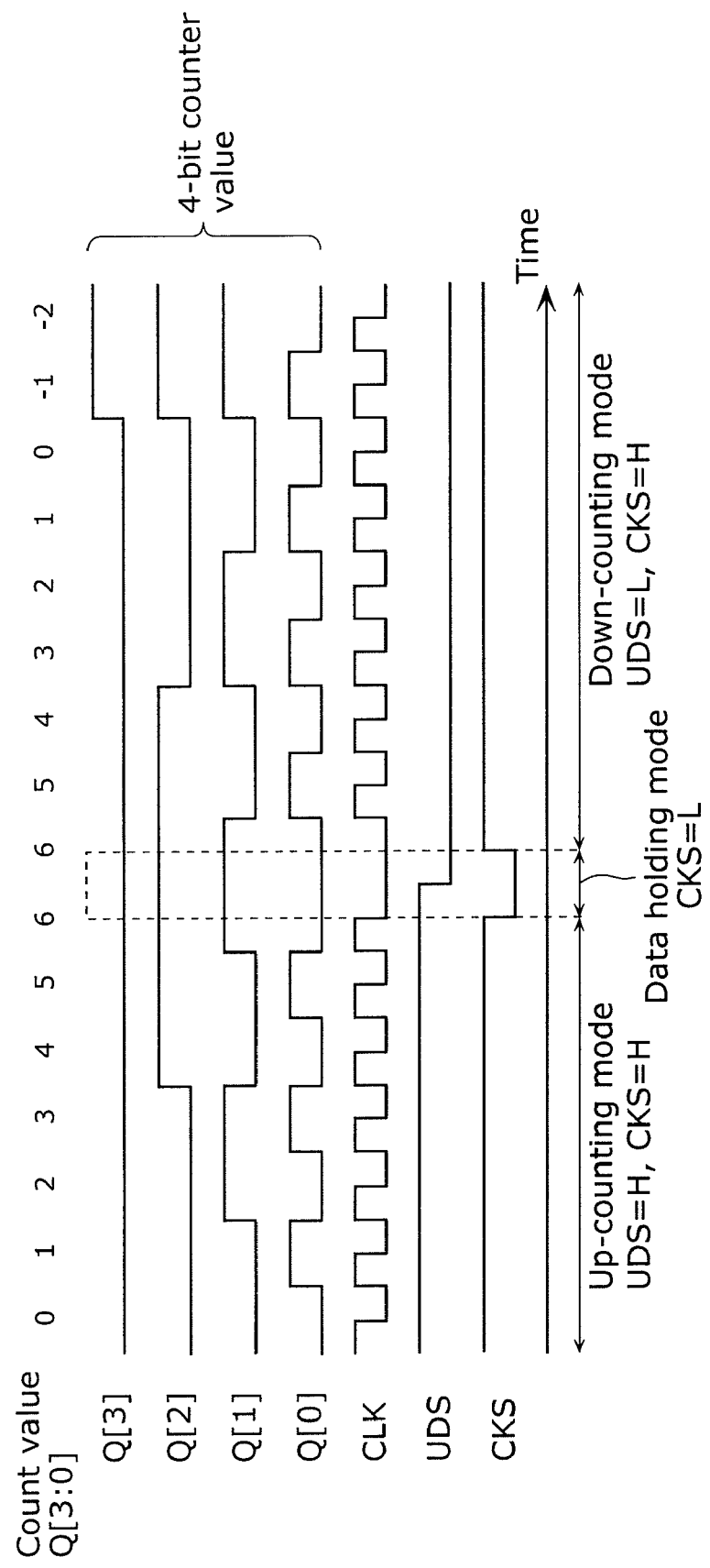
FIG. 3 is a timing chart showing an example of operation timing of the asynchronous counter.

FIG. 3 is a timing chart showing an example of operation timing of the asynchronous counter. First, with the process not to be described here, the count value Q is reset to zero. Next, CKS=H, which indicates the operation is in counting mode.

Here, since the control signal UDS is H, and the input of the clock signal CLK to the clock input T in the FF of the least significant bit starts. Since the UDS is in H, which shows that the connection between the bits by the second selectors 103, and the inverted output NQ in FF 101 is connected to the clock input T of the FF101 one bit higher. CKS is in H, which indicates that the operation is in the counting mode, and the value one bit higher changes when the data one bit lower changed from 1 to 0, and thus the asynchronous counter as a whole is performing up-counting. In FIG. 3, a positive edge of CLK is input for six times when both UDS and CKS are H, and the value of asynchronous counting is Q=6.

Next, CKS is switched to L, and the asynchronous counter is switched to the data holding mode. Subsequently, the counting direction is changed by switching UDS to L, even if there is change in CLK input, there is no change in the data since all of the FFs included in the asynchronous counter are in the data holding mode. Therefore, the problem of noise caused by the broken data and the recovery described in the conventional example does not occur.

The control signal UDS is in L, and the second selector 103 connects the output Q of the FF101 to the clock input T of the FF101 one bit higher.

Next, when CKS switched to H, which is the counting mode and CLK input resumes, the value one bit higher changes when the data one bit lower changes from 0 to 1, and thus the asynchronous counter as a whole starts down-counting. In FIG. 3, the positive edge of CLK is input 8 times, and addition and subtraction of the number of clock edges are calculated correctly (6−8=−2) as the asynchronous counter value Q, and no data is broken when switching the counting direction.

Note that, although the description is made for a 4-bit counter, the connection is scalable, and the present invention is applicable to a counter using 10 bits or more.

As described above, the solid-state imaging device according to the present invention does not change the count value held in the asynchronous counter when switching the operation settings indicating up-counting and down-counting, and thus it is possible to suppress the generation of noise and enhance the accuracy of AD conversion. In addition, it is suitable for improving frequency since it does not require a bit inversion and another bit inversion that were necessary in the conventional technology when switching the operation setting.

In addition, first selectors are provided outside the carry propagation path, and thus it is suitable for accelerating the AD conversion frequency without increasing the delay in carry propagation.

Since there is only one second selector 103 in each of the intervals between the flip-flops in the carry propagation path, it is possible to reduce the carry propagation delay compared to the conventional technology, and it is possible to avoid the limitation of the AD conversion frequency as a result.

Second Embodiment

An asynchronous counter using positive-edge D-FF is described in the first embodiment. An asynchronous counter using negative edge D-FFs is described in the second embodiment.

The configuration of the solid-state imaging device according to the second embodiment is the same as FIG. 1, and thus the description is omitted except the difference.

Figure 4:
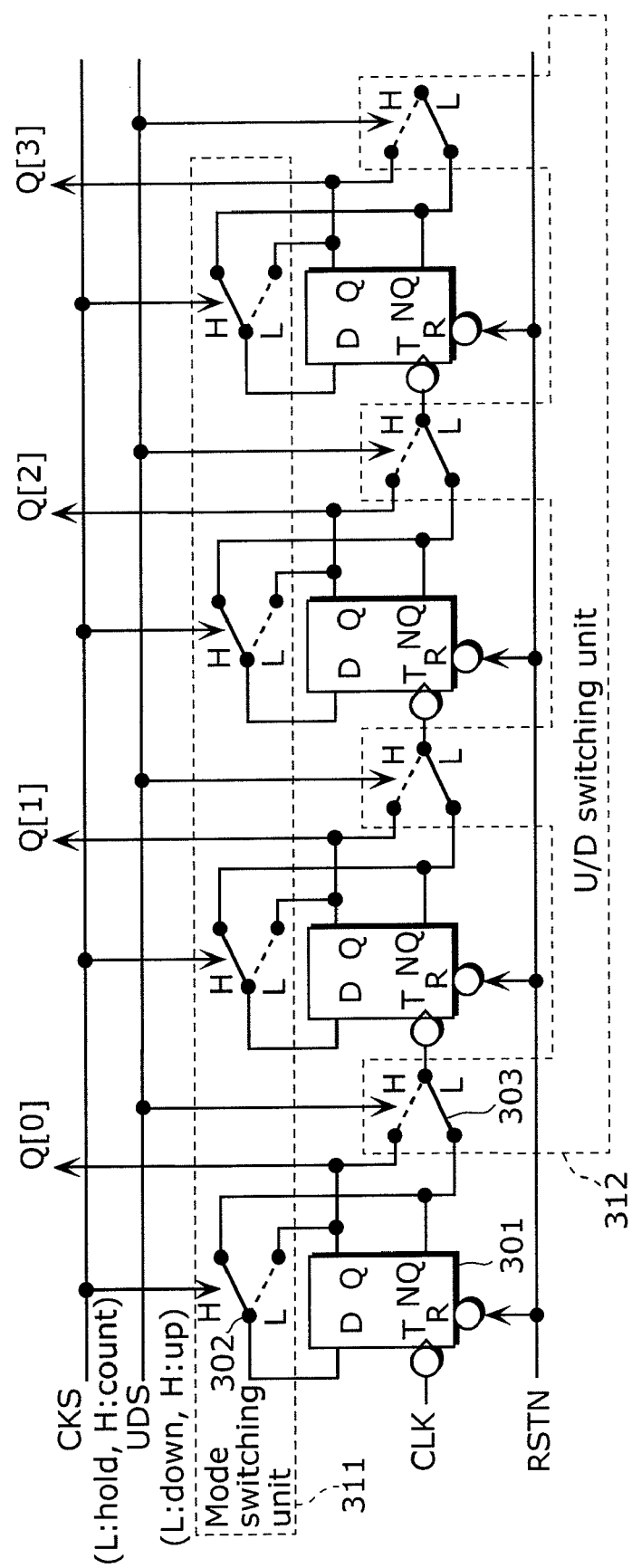
FIG. 4 is a circuit block diagram showing the configuration of the asynchronous counter as a specific example of the column U/D counter in the second embodiment.

FIG. 4 is a circuit block diagram showing the configuration of the asynchronous counter as the column U/D counter in the second embodiment. A circuit of one-bit in the asynchronous counter is configured through connecting the three circuit components, namely, the D flip-flop 301 with a negative edge reset, the first selector 302, and the second selector 303.

The connection is, in detail, in the same manner as the output Q and inverted output NQ is connected to input both the first selector 302 and the second selector 303. While the output of the first selector 302 is connected to the data input D of the same flip-flop 301, the output of the selector 303 is connected to the clock input T of the flip-flop 301 one bit higher.

Next, the change in the counter values with the control signals CKS and UDS in the asynchronous counter is described.

When the control signal CKS is in H, the first selector 302 connects the inverted output NQ in the FF 301 to the data input D in the same FF301. Here, when the signal inputted to the clock input T of each FF301 changes, the value of FF is inverted at the negative edge since the FF301 is a negative edge FF (counting mode).

Meanwhile, when the control signal CKS is in L, the first selector 302 connects the output Q in the FF301 to the data input D in the same FF301. Here, even if the signal inputted to the clock input T in each of FF301 changes, the value does not change (data holding mode).

Figure 5:
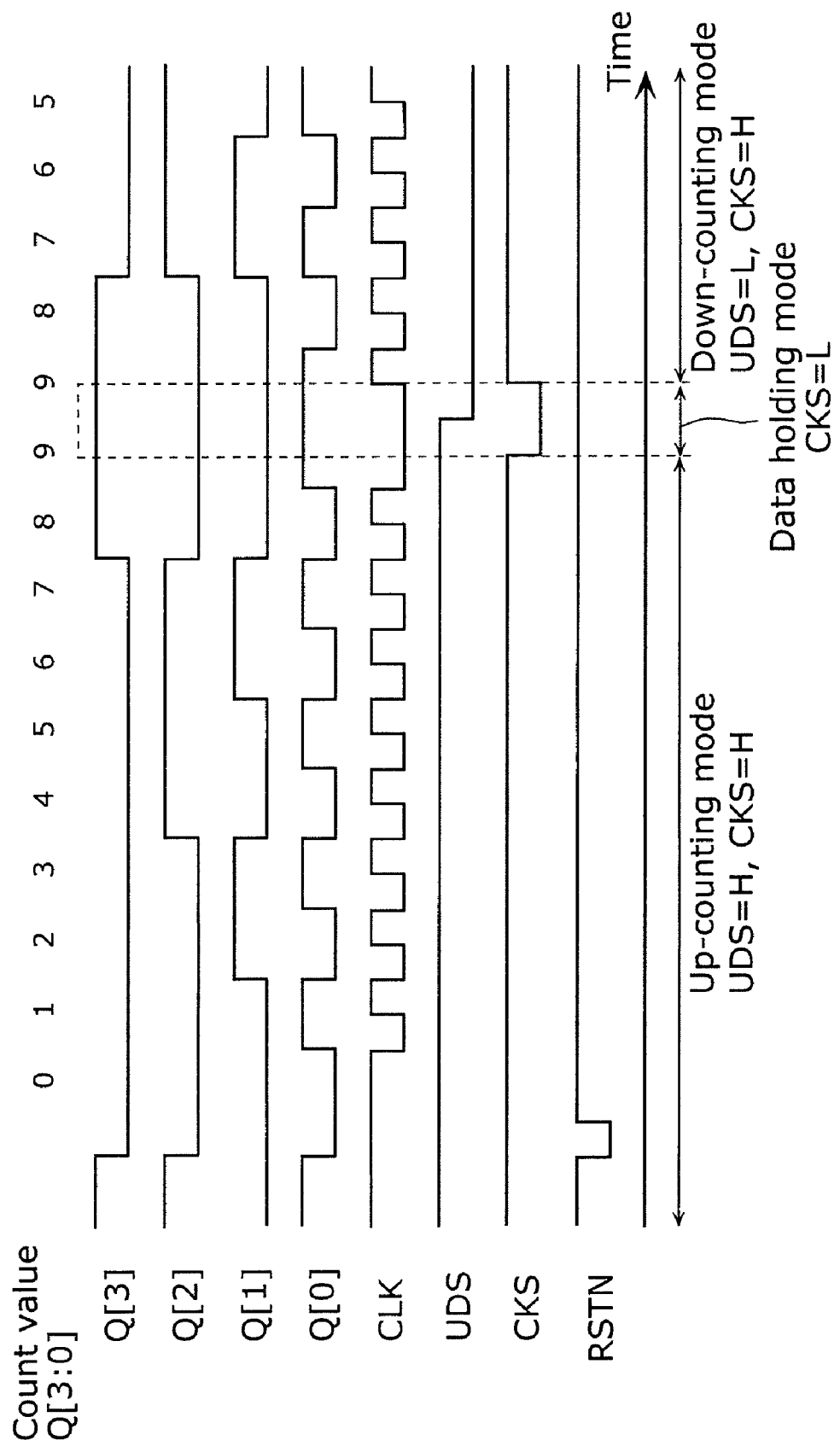
FIG. 5 is a timing chart showing an example of the operation timing of the asynchronous counter.
Figure 6:
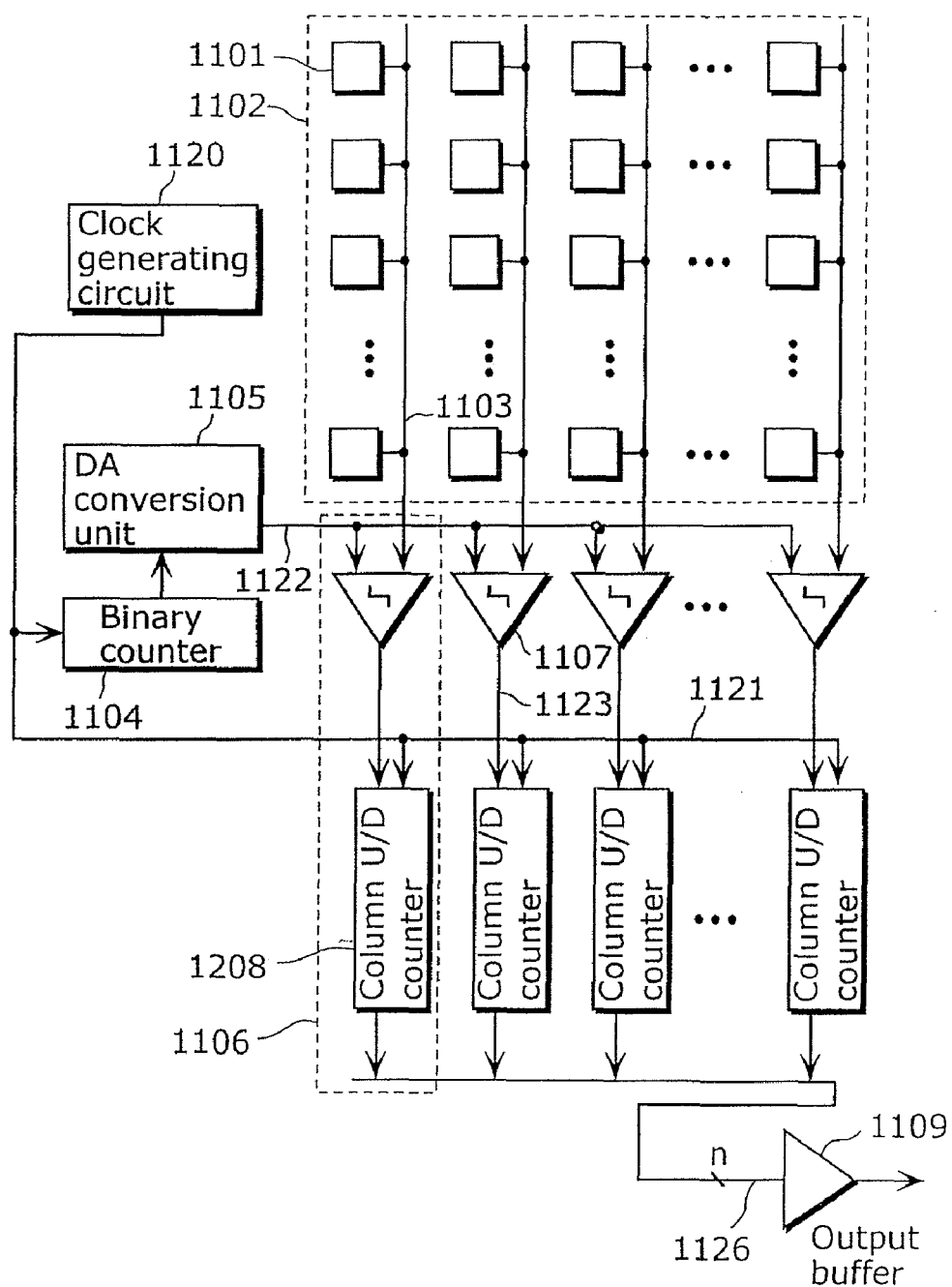
FIG. 6 is a diagram showing the configuration of MOS sensor according to the conventional technology.
Figure 7:
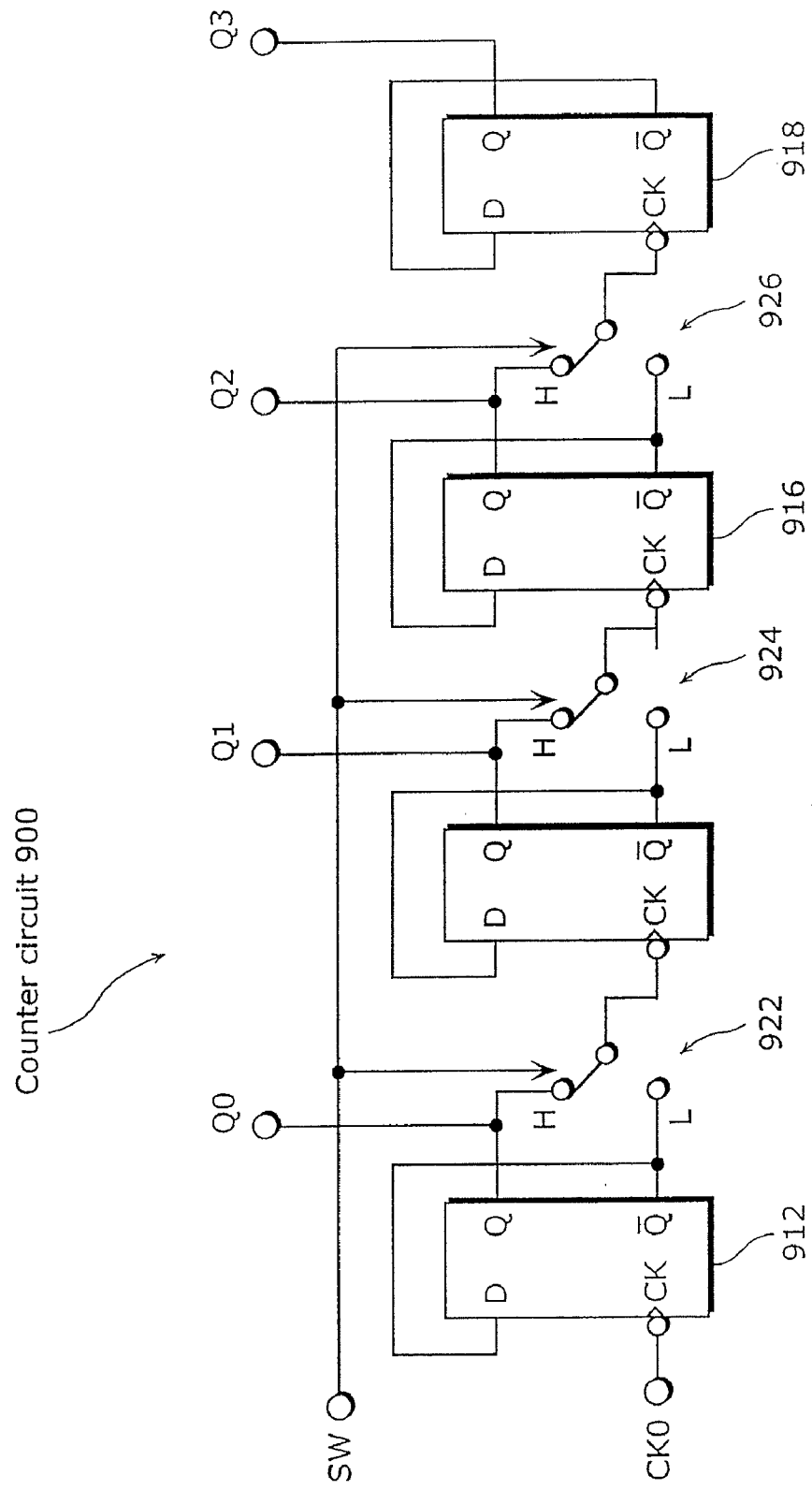
FIG. 7 is a block diagram showing a configuration of a general asynchronous ripple carry counter.
Figure 8:
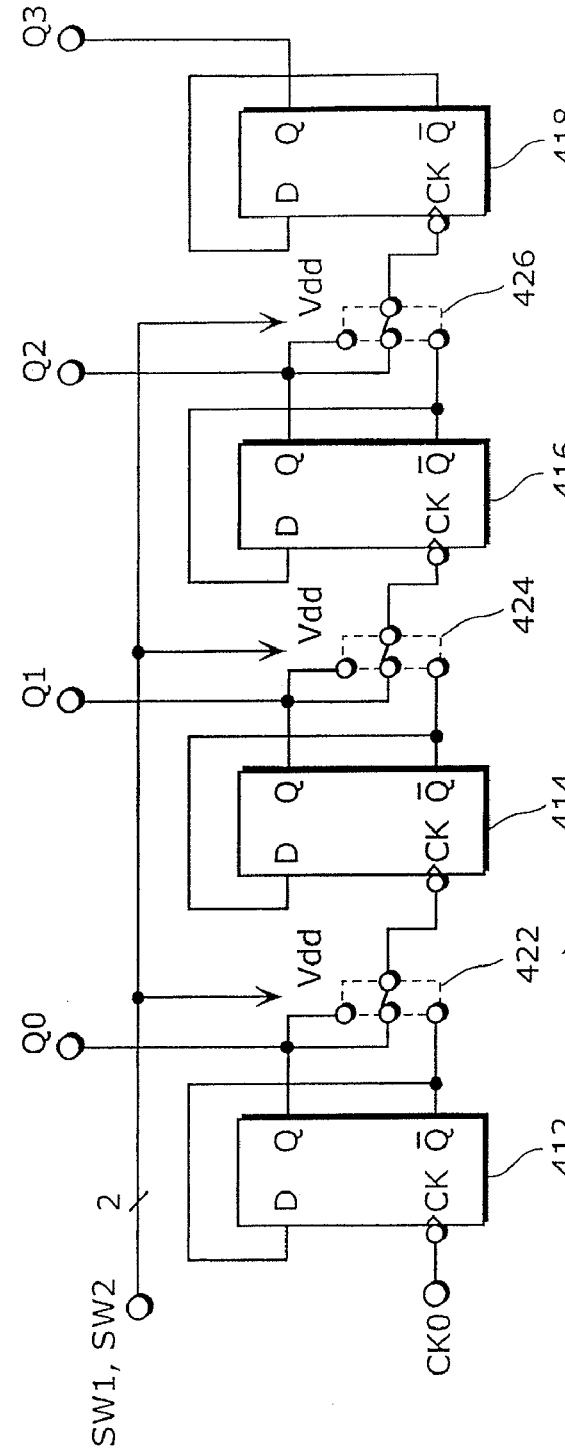
FIG. 8 is a block diagram showing the configuration of an asynchronous counter which recovers correct data by inverting the inverted bit again.
Figure 9:
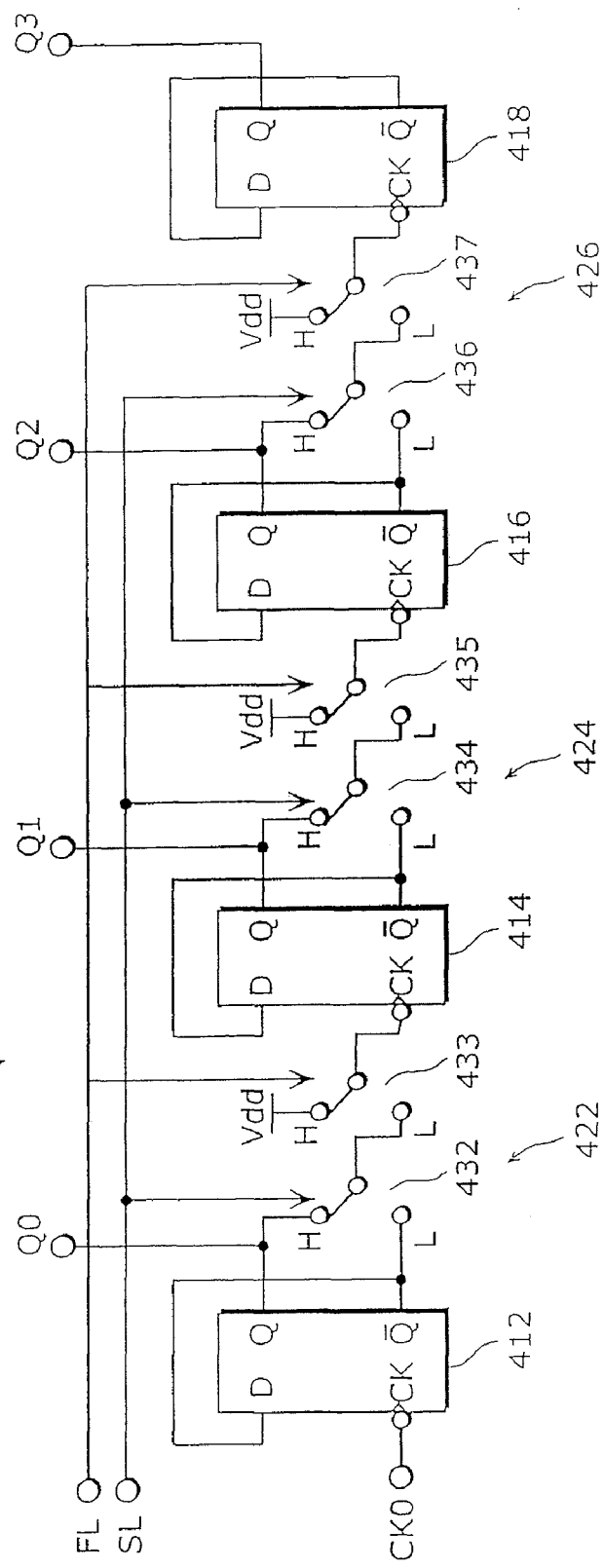
FIG. 9 is a block diagram showing the detailed configuration of FIG. 8.
Figure 10:
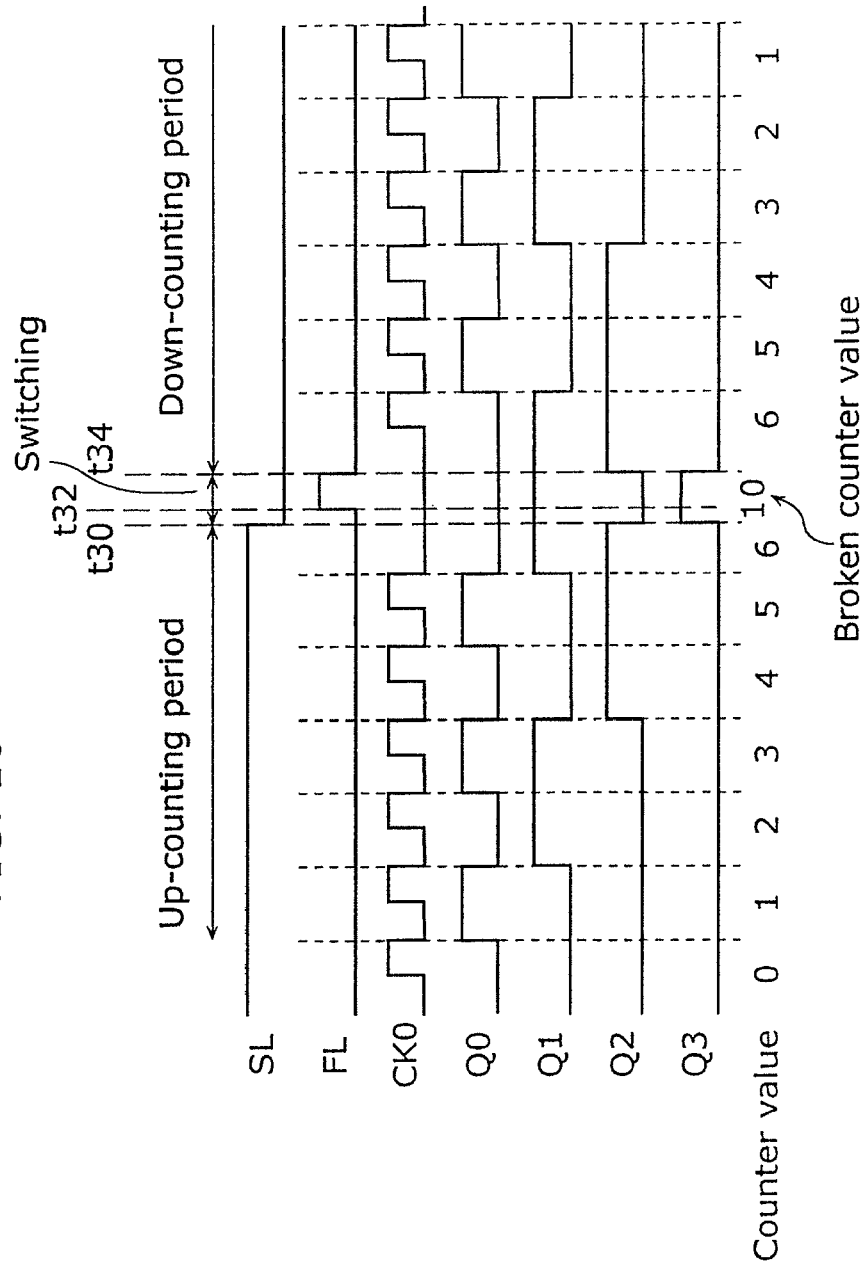
FIG. 10 is a waveform chart for describing the operation timing of the asynchronous counter according to the conventional technology.
Figure 11:
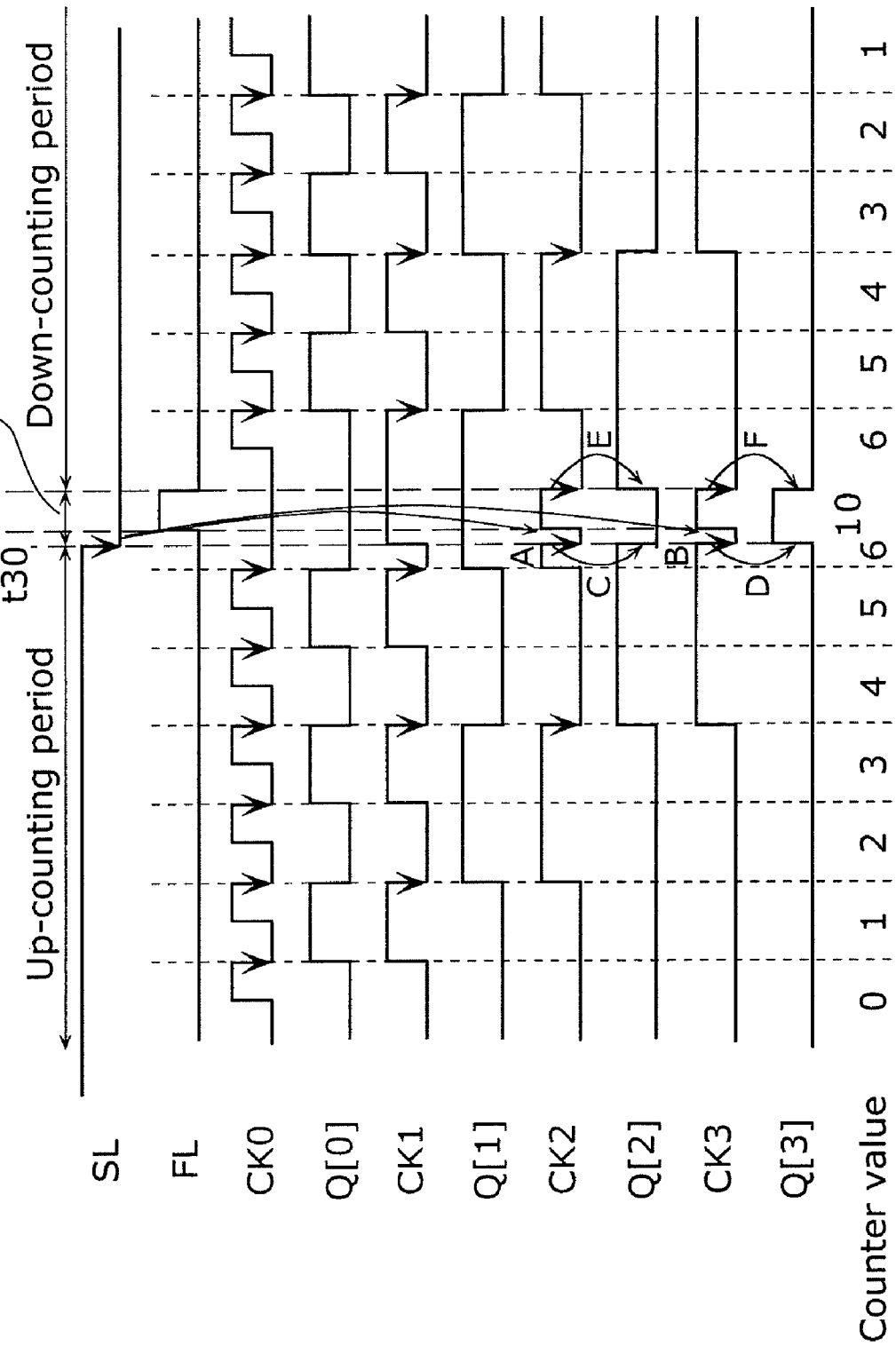
FIG. 11 is a waveform chart showing a detailed operation timing of FIG. 10.

FIG. 5 is a timing chart showing an example of operation timing of the asynchronous counter according to the second embodiment.

First, RSTN=L is inputted to the R terminal of FF301, and the count value Q is reset to zero.

Next, CKS=H, and thus the operation is performed in the counting mode, not the data holding mode.

Here, the control signal UDS is in H, and the input of the clock signal CLK to the clock input T in the FF of the least significant bit starts. Here, although UDS is in H, unlike the first embodiment, the connection between bits by the second selector 303 connects the inverted output Q of the FF301 is connected to the clock input T of the FF 301 one bit higher. CKS is in H, which indicates the counting mode. Unlike the first embodiment, since the FF301 is a negative edge FF, and the value one bit higher changes when the data one bit lower changed from 1 to 0, and thus the asynchronous counter as a whole performs up-counting. In FIG. 3, the negative edge of CLK is input for nine times when both UDS and CKS are in H, and the value of asynchronous counter is Q=9.

Next, CKS is switched to L, and the asynchronous counter is switched to the data holding mode. Subsequently, the counting direction is changed by switching UDS to L, even if there is change in CLK input, there is no change in the data since all of the FFs included in the asynchronous counter are in the data holding mode (same operation as the first embodiment).

The control signal UDS is already in L, and the second selector 303 connects the output Q of the FF301 to the clock input T of the FF301 one bit higher.

Next, when CKS is switched to H which indicates the counting mode and resumes CLK input, the value one bit higher changes when the data one bit lower changes from 0 to 1. Thus the asynchronous counter as a whole starts down-counting. In FIG. 3, the positive edge of CLK is input for 4 times, and addition and subtraction of the number of clock edges are calculated correctly (9−4=5) as the asynchronous counter value Q, and no data is broken when switching the counting direction.

Note that, although the description is made for a 4-bit counter, the connection is scalable, and the present invention is applicable to a counter using 10 bits or more.

Note that whether the asynchronous counter is configured with the positive edge D FF as shown in the first embodiment, or with the negative edge D FF as shown in the second embodiment may be determined appropriately in relation to the manufacturing process or the compatibility with other circuits.

In addition, the reset input of the FF may not be limited to asynchronous resetting, but may be synchronous resetting. Note that the initial value of the counter upon resetting is not limited to 0, and may be reset to an offset value (for example, the value corresponding to the maximum value of the reset level). In this case, the counter may be configured to set an initial value not the with the reset signal, but with a preset value.

In addition, the asynchronous counter in each of the embodiments outputs a negative count value by down-counting (complement of 2); only positive count values (or negative count values) may be counted by setting the initial value at an appropriate offset value.

Note that the asynchronous counter using D FFs is described. However, the FF is not limited to the D FF, and the asynchronous counter with the same function may be configured using other types of flip-flops.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

As described above, the solid-state imaging device according to the present invention and the driving method thereof are useful for detecting physical quantity distribution of various materials such as light and radiation, and are suitable for digital still cameras, cellular phone with a camera, a monitoring camera, a camera incorporated in a laptop computer, and a camera unit connected to the information processing device.

What is claimed is:

1. A solid-state imaging device comprising:
a plurality of pixel units arranged in rows and columns; and
column AD converters each of which corresponds to one of the columns of said plurality of pixel units and is configured to convert an analog signal output from a column to a digital signal,
wherein each of said column AD converters includes:
a comparator which compares the analog signal with a ramp signal; and
an asynchronous counter which counts an input signal until an output signal from said comparator is inverted, and
said asynchronous counter has, as operation modes, an up-counting mode for up-counting, a down-counting mode for down-counting, and a holding mode for switching an operation setting between the up-counting and the down-counting while holding a count value held in said asynchronous counter without changing the count value during the holding mode.

2. The solid-state imaging device according to claim 1, wherein said asynchronous counter includes:
a plurality of stages of flip-flops each of which includes a data input terminal, a clock input terminal, a non-inverted output terminal and an inverted output terminal;
a first switch configured to switch between the holding mode and either the up-counting mode or the down-counting mode; and
a second switch configured to switch the operation setting between the up-counting and the down-counting in the holding mode.

3. The solid-state imaging device according to claim 2, wherein the first switch includes
a plurality of first selectors, each of which corresponds to one of the plurality of stages of flip-flops, and
each of the plurality of first selectors selects one of two signals respectively output from the non-inverted output terminal and the inverted output terminal of the corresponding flip-flop, outputs the selected signal to a data input terminal of the corresponding flip-flop and the operation mode is set to the holding mode when the signal output from the non-inverted output terminal is selected.

4. The solid-state imaging device according to claim 2, wherein said second switch includes
a plurality of second selectors, each of which corresponds to an interval between said plurality of stages of flip-flops,
each of said plurality of second selectors selects one of two signals respectively output from the non-inverted output terminal and the inverted output terminal of a flip-flop in a previous stage, outputs the selected signal to the clock input terminal of a flip-flop in a subsequent stage, and switches the selection during a period within the holding mode.

5. A solid-state imaging device, comprising:
a plurality of pixel units arranged in rows and columns; and
column AD converters, each of which corresponds to one of the columns of said plurality of pixel units and is configured to convert an analog signal output from a column to a digital signal,
wherein each of said column AD converters includes:
a comparator which compares the analog signal with a ramp signal; and
an asynchronous counter which switches up-counting and down-counting to measure a time period until an output signal from said comparator is inverted, and
said asynchronous counter includes:
a plurality of stages of flip-flops each of which includes a data input terminal, a clock input terminal, a non-inverted output terminal and an inverted output terminal;
a plurality of first selectors each of which corresponds to each of the plurality of stages of flip-flops; and
a plurality of second selectors each of which corresponds to an interval between the plurality of stages of flip-flops,
each of the plurality of first selectors selects one of two signals respectively output from the non-inverted output terminal and the inverted output terminal of the corresponding flip-flop, and outputs the selected signal to a data input terminal of the corresponding flip-flop, and
each of the plurality of second selectors selects one of two signals respectively output from the non-inverted output terminal and the inverted output terminal of a flip-flop in a previous stage, and outputs the selected signal to the clock input terminal of a flip-flop in a subsequent stage.

6. A method for driving a solid-state imaging device including a plurality of pixel units arranged in rows and columns and column AD converters each of which corresponds to one of the columns of the plurality of pixel units and is configured to convert an analog signal output from a column to a digital signal, wherein, each of the column AD converters includes: a comparator which compares the analog signal with a ramp signal; and an asynchronous counter which counts an input signal until an output signal from the comparator is inverted, the asynchronous counter has, as operation modes, an up-counting mode for up-counting, a down-counting mode for down-counting, and a holding mode for switching an operation setting between the up-counting and the down-counting while holding a count value held in the asynchronous counter, the driving method comprising:

converting an analog signal indicating standard component to a digital signal in the up-counting mode or the down-counting mode;

switching the asynchronous counter to the holding mode, wherein the count value indicating the converted digital signal is held in the asynchronous counter without changing the count value during the holding mode;

switching the operation setting between the up-counting and the down-counting in the asynchronous counter in the holding mode, while holding count value in the asynchronous counter without changing the count value;

switching the holding mode to the other of the up-counting mode and the down-counting mode; and converting an analog signal indicating signal component to a digital signal in the up-counting mode or the down-counting mode.

7. A camera comprising the solid-state imaging device according to claim 1.

8. The solid-state image device according to claim 1, wherein the asynchronous counter holds the count value without breaking and restoring the count value during the holding mode.

9. The method for driving a solid-state imaging device according to claim 6, wherein the switching the operation setting between the up-counting and the down counting in the asynchronous counter in the holding mode, is without breaking and restoring the counting value.

10. The method for driving a solid-state imaging device according to claim 6, wherein the asynchronous counter includes: a plurality of stages of flip-flops each of which includes a data input terminal, a clock input terminal, a non-inverted output terminal and an inverted output terminal; a first switch configured to switch between the holding mode and either the up-counting mode or the down-counting mode; and a second switch configured to switch the operation setting between the up-counting and the down-counting in the holding mode, the switching the asynchronous counter to the holding mode is performed by switching the first switch, and the switching the operation setting between the up-counting and the down-counting is performed by switching the second switch during the holding mode.

11. The method for driving a solid-state imaging device according to claim 10, wherein the first switch includes a plurality of first selectors, each of which corresponds to one of the plurality of stages of flip-flops, and each of the plurality of first selectors selects one of two signals respectively output from the non-inverted output terminal and the inverted output terminal of the corresponding flip-flop and outputs the selected signal to a data input terminal of the corresponding flip-flop, and the switching the first switch for switching the asynchronous counter to the holding mode is performed by selecting the non-inverted output terminal of the corresponding flip-flop.

12. The method for driving a solid-state imaging device according to claim 10, wherein the second switch includes a plurality of second selectors, each of which corresponds to an interval between the plurality of stages of flip-flops, and each of the plurality of second selectors selects one of two signals respectively output from the non-inverted output terminal and the inverted output terminal of a flip-flop in a previous stage, and outputs the selected signal to the clock input terminal of a flip-flop in a subsequent stage, and the switching the second switch for switching the operation setting between the up-counting and the down-counting is performed by switching the second selectors during the holding mode.

* * * * *